(12) United States Patent
Chen

(10) Patent No.: US 11,079,791 B2
(45) Date of Patent: Aug. 3, 2021

(54) ELECTRONIC DEVICE

(71) Applicant: Lenovo (Beijing) Co., Ltd., Beijing (CN)

(72) Inventor: Xi Chen, Beijing (CN)

(73) Assignee: LENOVO (BEIJING) CO., LTD., Beijing (CN)

( * ) Notice: Subject to any disclaimer, the term of this patent is extended or adjusted under 35 U.S.C. 154(b) by 0 days.

(21) Appl. No.: 16/457,241

(22) Filed: Jun. 28, 2019

(65) Prior Publication Data
US 2020/0004292 A1    Jan. 2, 2020

(30) Foreign Application Priority Data

Jun. 29, 2018    (CN) .......................... 201810699868.3

(51) Int. Cl.
| | | |
|---|---|---|
| *G06F 1/16* | (2006.01) | |
| *H05K 5/02* | (2006.01) | |
| *H02J 7/02* | (2016.01) | |

(52) U.S. Cl.
CPC ............ *G06F 1/1605* (2013.01); *H02J 7/025* (2013.01); *H05K 5/0217* (2013.01); *H05K 5/0226* (2013.01); *H05K 5/0234* (2013.01)

(58) Field of Classification Search
CPC ... G06F 1/1605; G06F 1/1601; H05K 5/0234; H05K 5/0226; H05K 5/0217; H02J 7/025; H02J 50/005
See application file for complete search history.

(56) References Cited

U.S. PATENT DOCUMENTS

| | | | | |
|---|---|---|---|---|
| 5,200,913 | A * | 4/1993 | Hawkins ............... | G06F 1/1615 345/168 |
| 6,288,891 | B1 * | 9/2001 | Hasegawa ............. | F16M 11/10 248/923 |
| 7,245,481 | B2 * | 7/2007 | Shimizu ............... | F16M 11/046 248/284.1 |
| 7,513,468 | B2 * | 4/2009 | Jung .................... | F16M 11/046 248/133 |
| 9,277,659 | B2 * | 3/2016 | Onda ................... | H05K 5/0221 |
| 9,372,512 | B2 * | 6/2016 | Yeh ....................... | G06F 1/1675 |
| 9,377,810 | B2 * | 6/2016 | Hishinuma ........... | G06F 1/1613 |
| 9,464,752 | B2 * | 10/2016 | Truong ................. | F16M 11/10 |
| 9,671,831 | B2 * | 6/2017 | Saito .................... | G06F 1/1681 |
| 9,991,923 | B2 * | 6/2018 | Yan ....................... | H04M 1/12 |
| 10,344,797 | B2 * | 7/2019 | Park ..................... | H04M 1/04 |
| 2004/0114319 | A1 * | 6/2004 | Hill ...................... | G06F 1/1654 361/679.28 |

(Continued)

*Primary Examiner* — Adrian S Wilson
*Assistant Examiner* — Theron S Milliser
(74) *Attorney, Agent, or Firm* — Anova Law Group, PLLC

(57) ABSTRACT

An electronic device is provided. The electronic device includes a multimedia output unit for outputting multimedia content; a bracket component for supporting the multimedia output unit and having a first end and a second end opposite to the first end. The second end is connected to the multimedia output unit. The electronic device further includes a processing unit for transmitting the multimedia content to the multimedia output unit. In response to the electronic device being placed on a supporting surface, an orthogonal projection of the first end of the bracket component on the supporting surface is positioned differently from an orthogonal projection of the processing unit on the supporting surface.

19 Claims, 3 Drawing Sheets

(56) References Cited

U.S. PATENT DOCUMENTS

| | | | |
|---|---|---|---|
| 2005/0052834 A1* | 3/2005 | Tanaka | G06F 1/1679 361/679.27 |
| 2006/0077622 A1* | 4/2006 | Keely | G06F 1/1624 361/679.09 |
| 2007/0058329 A1* | 3/2007 | Ledbetter | F16M 11/2021 361/679.06 |
| 2012/0194977 A1* | 8/2012 | Liu | G06F 1/162 361/679.01 |
| 2014/0085795 A1* | 3/2014 | Xia | G06F 1/162 361/679.09 |
| 2015/0002998 A1* | 1/2015 | Arima | G06F 1/1637 361/679.27 |
| 2015/0077915 A1* | 3/2015 | Saito | G06F 1/1601 361/679.22 |
| 2015/0192966 A1* | 7/2015 | Kim | G06F 1/1681 361/679.28 |
| 2016/0036478 A1* | 2/2016 | Wong | H04B 1/3883 455/573 |
| 2017/0104356 A1* | 4/2017 | Yu | H02J 50/402 |
| 2019/0252768 A1* | 8/2019 | Kim | H02J 50/005 |
| 2019/0348209 A1* | 11/2019 | Wen | H01F 41/043 |

* cited by examiner

ELECTRONIC DEVICE

CROSS-REFERENCES TO RELATED APPLICATIONS

This application claims the priority of Chinese Patent Application No. 201810699868.3, filed on Jun. 29, 2018, the entire content of which is incorporated herein by reference.

FIELD OF THE DISCLOSURE

The present disclosure generally relates to the field of electronic device technology and, more particularly, relates to an electronic device.

BACKGROUND

In an all-in-one computer, a display screen is often fixed on top of a platform through a bracket, such that the display screen, the bracket, and the platform are stacked from top to bottom, resulting in a relatively high center of gravity of the all-in-one computer with poor mechanical support stability.

The disclosed electronic device is directed to solve one or more problems set forth above and other problems in the art.

BRIEF SUMMARY OF THE DISCLOSURE

One aspect of the present disclosure provides an electronic device. The electronic device includes a multimedia output unit for outputting multimedia content; a bracket component for supporting the multimedia output unit and having a first end and a second end opposite to the first end, wherein the second end is connected to the multimedia output unit; and a processing unit for transmitting the multimedia content to the multimedia output unit. In response to the electronic device being placed on a supporting surface, an orthogonal projection of the first end of the bracket component on the supporting surface is positioned differently from an orthogonal projection of the processing unit on the supporting surface.

Further, in another embodiment, the electronic device includes a multimedia output unit for outputting multimedia content; a bracket component for supporting the multimedia output unit and having a first end and a second end opposite to the first end, wherein the second end is connected to the multimedia output unit; and a processing unit for transmitting the multimedia content to the multimedia output unit. In response to the electronic device being placed on a supporting surface, an orthogonal projection of the first end of the bracket component on the supporting surface is positioned differently from an orthogonal projection of the processing unit on the supporting surface. A region for accommodating an inputting unit is positioned on a top surface of the processing unit.

Further, in another embodiment, the electronic device includes a multimedia output unit for outputting multimedia content; a bracket component for supporting the multimedia output unit and having a first end and a second end opposite to the first end, wherein the second end is connected to the multimedia output unit; and a processing unit for transmitting the multimedia content to the multimedia output unit. In response to the electronic device being placed on a supporting surface, an orthogonal projection of the first end of the bracket component on the supporting surface is positioned differently from an orthogonal projection of the processing unit on the supporting surface. A wireless charging component is placed on a top surface of the processing unit or in a second section of the supporting component.

Other aspects of the present disclosure can be understood by those skilled in the art in light of the description, the claims, and the drawings of the present disclosure.

BRIEF DESCRIPTION OF THE DRAWINGS

To more clearly illustrate the technical solution in the present disclosure, the accompanying drawings used in the description of the disclosed embodiments are briefly described hereinafter. The drawings described below are merely some embodiments of the present disclosure. Other drawings may be derived from such drawings by a person with ordinary skill in the art without creative efforts and may be encompassed in the present disclosure.

DETAILED DESCRIPTION

Figure 1:
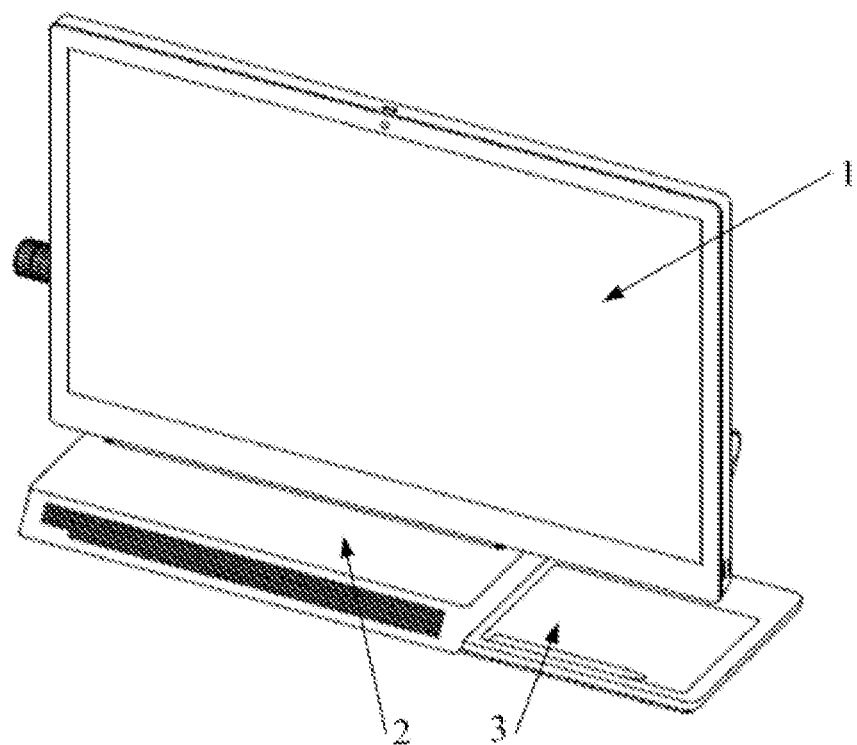
FIG. 1 illustrates a 3-dimensional schematic view of an example of an electronic device according to some embodiments of the present disclosure.

To make the foregoing objectives, features and advantages of the present disclosure clearer and more understandable, the present disclosure will be further described with reference to the accompanying drawings and embodiments. However, exemplary embodiments may be embodied in various forms and should not be construed as limited to the embodiments set forth herein. Rather, these embodiments are provided to fully convey the thorough and complete concepts of the exemplary embodiments to those skilled in the art.

The present disclosure provides an electronic device with improved mechanical support stability. As shown in FIGS. 1-5, the electronic device includes a multimedia output unit 1 for outputting multimedia content, a bracket component 4 for supporting the multimedia output unit 1 and having a first end and a second end disposed opposite to the first end and connected to the multimedia output unit 1, and a processing unit 2 for at least transmitting the multimedia content to the multimedia output unit 1. After the electronic device is placed on top of a supporting surface, the first end of the bracket component 4 and the processing unit 2 have different orthogonal projections on the supporting surface.

Because the first end of the bracket component 4 and the processing unit 2 have different orthogonal projections on the supporting surface after the electronic device is placed on top of the supporting surface, the bracket component 4 may not be stacked on top of the processing unit 2. That is, the bracket component 4 and the processing unit 2 may be arranged horizontally side-by-side on the supporting surface. Further, because the bracket component 4 supports the multimedia output unit 1, an installation height of the multimedia output unit 1 is indirectly lowered. Thus, the center of gravity of the electronic device is lowered, and the mechanical support stability is improved.

The electronic device provided by the present disclosure may be a computer or a television set, etc. In response to the electronic device being the all-in-one computer, the multimedia output unit 1 may be a display screen, a printer, a plotter, and an audio module, etc. The processing unit 2 may be a computer motherboard.

In one embodiment, the electronic device may further include a supporting component 5 having a first side and a second side disposed opposite to the first side. After the electronic device is placed on top of the supporting surface, the supporting component 5 supports other modules (i.e., all other modules except for the supporting component 5) of the electronic device, and the first side faces toward the supporting surface. The first end of the bracket component 4 is configured in a first region of the second side. The processing unit 2 is configured in a second region of the second side. The first region and the second region are different.

In one embodiment, the supporting component 5 is configured on top of the supporting surface (e.g., a tabletop surface). The first side (e.g., a bottom surface) of the supporting component 5 is attached to the supporting surface. The first end of the bracket component 4 and the processing unit 2 may be configured in different regions on the second side (e.g., a top surface) of the supporting component 5, respectively. As such, the bracket component 4 and the processing unit 2 are arranged side-by-side on the second side of the supporting component 5 to avoid vertically stacking up the bracket component 4 and the processing unit 2. Thus, the center of gravity of the electronic device is lowered.

In some embodiments of the present disclosure, both the bracket component 4 and the processing unit 2 are configured on the second side of the supporting component 5. Through the supporting component 5, the bracket component 4 and the processing unit 2 are attached together to form an integral body, thereby making it convenient for assembling and transporting. In some other embodiments, the supporting component 5 may not be included in the electronic device. The bracket component 4 and the processing unit 2 may be directly connected to each other by screws and rivets, etc., or may be disposed separately.

In one embodiment, the first region and the second region are adjacent to each other. That is, the orthogonal projections of the first end of the bracket component 4 and the processing unit 2 on the supporting surface are adjacent to each other to improve structural compactness. A gap or other structures such as a shelf may be configured between the first region and the second region.

In one embodiment, to simplify the structure of the electronic device, the supporting component 5 may include a supporting bottom plate. Both the processing unit 2 and the bracket component 4 are configured on the supporting bottom plate. The first end of the bracket component 4 is lower than a top surface of the processing unit 2. The first end of the bracket component 4 may be disposed at a same level as a bottom surface of the processing unit 2 or slightly higher than the bottom surface of the processing unit 2. Through lowering a height of the first end of the bracket component 4, a supporting height of the multimedia output unit 1 is lowered, thereby lowering the center of gravity of the electronic device.

In one embodiment, the first end of the bracket component 4 is configured in the first region of the supporting bottom plate, and the processing unit 2 is configured in the second region of the supporting bottom plate. The supporting bottom plate combines the processing unit 2 and the bracket component 4 into one integral body to simplify the structure of the electronic device. Further, the supporting bottom plate may have a substantially large contact area to contact with the supporting surface, thereby improving the mechanical support stability.

Further, the supporting component 5 may include other structures such as a supporting bracket to achieve the same function as the bracket component 4 for supporting the processing unit 2. The present disclosure does not limit configurations of the supporting component 5. The first end of the bracket component 4 may be configured directly on the supporting bottom plate or indirectly through an intermediate connecting plate. That is, the connecting plate is stacked in the first region of the supporting bottom plate, and the first end of the bracket component 4 is mounted on the connecting plate.

In one embodiment, the multimedia output unit 1 may rotate relative to the supporting surface through a hinge structure. By rotating the hinge structure, the multimedia output unit 1 may rotate relative to the supporting surface. As such, an outputting surface of the multimedia output unit 1 may be positioned at various angles to adapt to the needs of various users and to improve adaptability of the electronic device. In another embodiment, no hinge structure may be configured. As such, the multimedia output unit 1 may be positioned at a fixed angle with respect to the supporting surface. In response to the electronic device being the television set, the display screen of the multimedia output unit 1 may be positioned permanently perpendicular to the supporting surface (i.e., placed on the tabletop surface).

In one embodiment, the hinge structure includes a first hinge structure 7 connecting between the multimedia output unit 1 and the second end of the bracket component 4 and a second hinge structure 8 connecting between the first end of the bracket component 4 and the supporting component 5. By rotating the first hinge structure 7 and the second hinge structure 8, the multimedia output unit 1 and the supporting surface may change from a first relative position relationship to a second relative position relationship. In response to the second relative position relationship between the multimedia output unit 1 and the supporting surface, the multimedia output unit 1 and the supporting surface may form an accommodating space to accommodate the processing unit 2, and the bracket component 4 and the supporting component 5 may form a storage space.

In one embodiment, the hinge structure includes two hinges to enable a substantially wide angle for the multimedia output unit 1 to rotate relative to the supporting surface. The first relative position relationship between the multimedia output unit 1 and the supporting surface may be a 90° angle between the multimedia output unit 1 and the supporting surface. The second relative position relationship between the multimedia output unit 1 and the supporting surface may be placing the multimedia output unit 1 onto the supporting surface. That is, one end of the multimedia output unit 1 may contact the supporting surface, for example, when the multimedia output unit 1 and the supporting surface form a 45° angle. In this case, both the supporting surface and the bracket component 4 jointly support the multimedia output unit 1 to increase the stability of the multimedia output unit 1 positioned at this angle. Moreover, the multimedia output unit 1 and the supporting surface form the accommodating space to accommodate the processing unit 2, and the bracket component 4 and the supporting component 5 form the storage space to provide a storage function to store a smartphone, etc. Thus, the adaptability of the electronic device is ensured.

Because there is a height difference between the second side of the supporting component 5 and a top surface of the processing unit 2, the storage space may be formed. In response to the second relative position relationship between the multimedia output unit 1 and the supporting surface, that is, the display screen is placed on top of the supporting surface, the entire bracket component 4 may be accommodated in the storage space. The entire bracket component 4 may be lower than the top surface of the processing unit 2 to further lower the center of gravity of the multimedia output unit 1 and the bracket component 4 and to improve the mechanical support stability.

In one embodiment, the first hinge structure 7 and the second hinge structure 8 may include rotationally coupled pins and pin holes. In other embodiments, the hinge structure may include only the first hinge structure 7 or only the second hinge structure 8.

Figure 4:
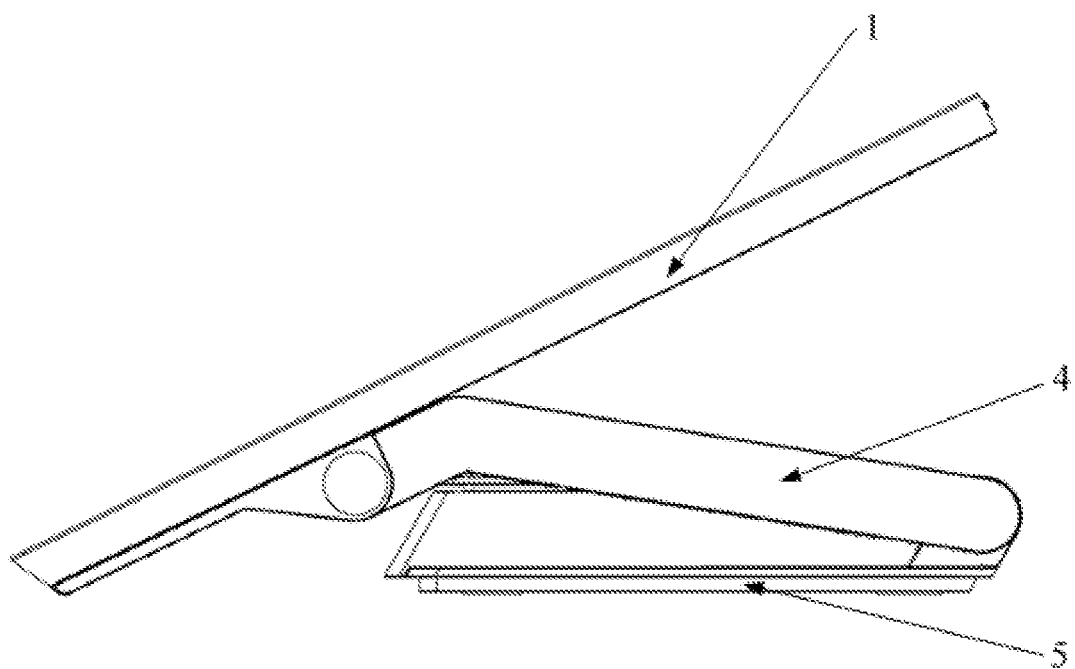
FIG. 4 illustrates a side view of an example of the electronic device with a multimedia output unit placed on top of a supporting surface according to some embodiments of the present disclosure.

In the electronic device provided by the present disclosure, the orthogonal projection of the multimedia output unit 1 on the supporting surface may at least partially overlap with the orthogonal projections of the first region and the second region on the supporting surface. In addition, the supporting component 5 includes a first section and a second region adjacent to the first section. The processing unit 2 is disposed in the first section. The bracket component 4 is connected to a portion of the second section away from the outputting surface of the multimedia output unit 1. As shown in FIG. 4, in response to the outputting surface of the multimedia output unit 1 facing toward a user, the bracket component 4 is connected to a peripheral region of the rear end of the supporting component 5.

In one embodiment, the orthogonal projection of the multimedia output unit 1 (e.g., the display screen) on the supporting surface may at least partially overlap with the orthogonal projections of the first region and the second region on the supporting surface. That is, a length of the display screen covers both the first region and the second region. Because of the height difference between the processing unit 2 and the second end of the bracket component 4, after the relatively taller processing unit 2 is accommodated, there is additional space for storage in the relatively shorter portion.

The first section and the second section are two large sections of the supporting component 5. A rear end of the second section (on the right-hand side) may be configured to connect the bracket component 4 (i.e., in the previously described second region). Excluding the second region, the remaining portion of the second section may be used as the storage space.

In one embodiment, the multimedia output unit 1 is stacked on the processing unit 2 and the bracket component 4, resulting in a compact structural configuration. The first end of the bracket component 4 is connected to the rear end of the second section. In response to the second relative position relationship between the multimedia output unit 1 and the supporting surface, the bracket component 4 and the remaining portion of the second section of the supporting component 5 may form a substantially large space for storage, as shown in FIG. 4. In other embodiments, the second end of the bracket component 4 may also be connected to a center or a front end of the second section of the supporting component 5.

Figure 2:
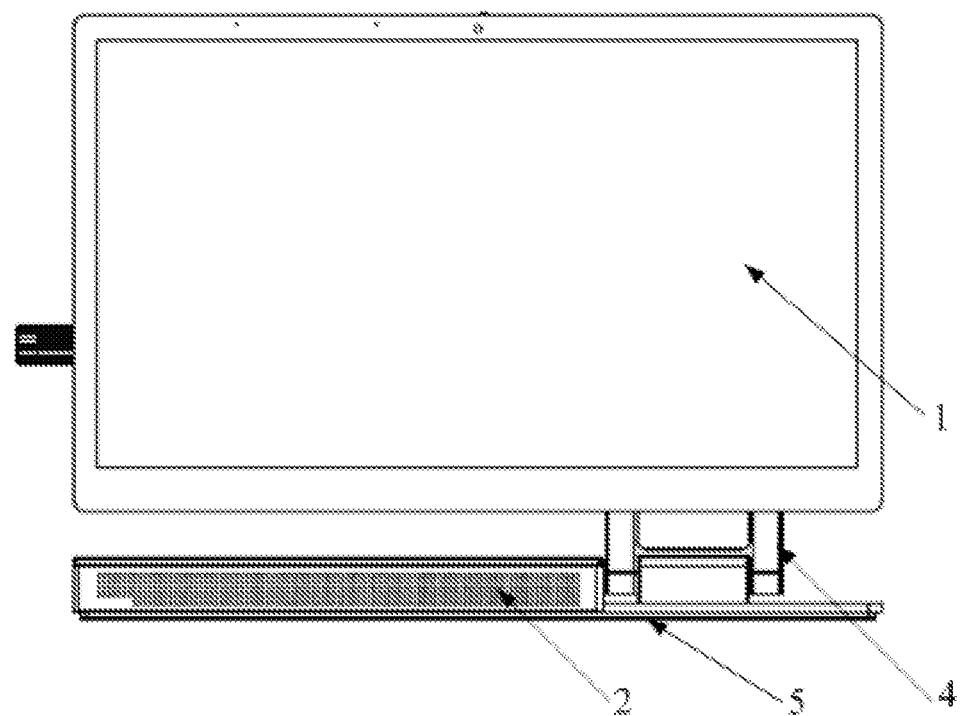
FIG. 2 illustrates a front view of an example of the electronic device according to some embodiments of the present disclosure.

As shown in FIG. 1 and FIG. 2, in response to that the outputting surface of the multimedia output unit 1 faces toward the user, the first section of the supporting component 5 is a portion of the supporting component 5 located on the left side of the user, and the second section of the supporting component 5 is a portion of the supporting component 5 located on the right side of the user. The processing unit 2 is disposed on the left side. The bracket component 4 is disposed on the right side. The processing unit 2 and the bracket component 4 form an asymmetrical left-to-right structure.

In one embodiment, the first section of the supporting component 5 may be disposed on both sides of the second section. That is, the bracket component 4 is disposed in the center, and the processing unit 2 is divided into two parts, disposed on both sides of the bracket component 4, respectively. In another embodiment, the first section of the supporting component 5 may surround the second section. That is, the bracket component 4 is disposed in a center opening of the processing unit 2. In this case, the processing unit 2 and the bracket component 4 form a symmetrical left-to-right structure. Other configurations may be possible as long as the processing unit 2 and the bracket component 4 are arranged side-by-side on the supporting surface. The present disclosure does not limit configurations of the processing unit 2 and the bracket component 4.

Figure 3:
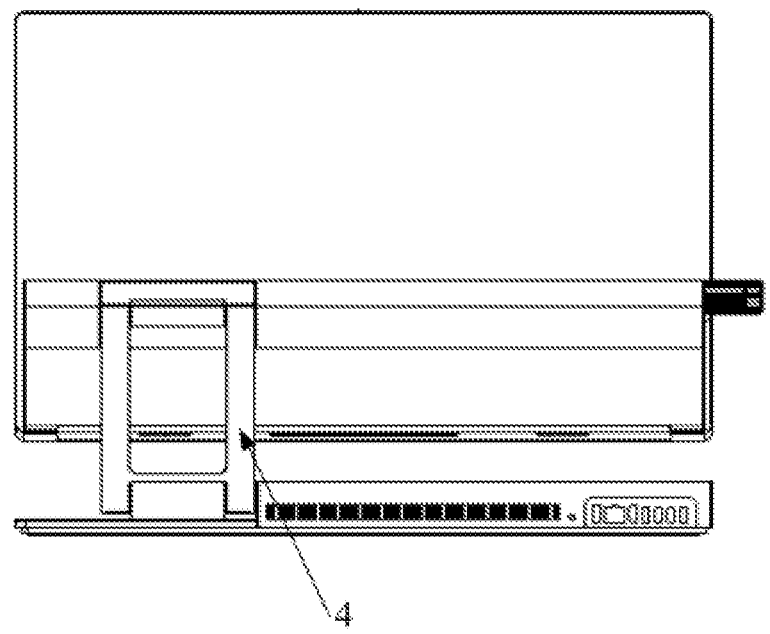
FIG. 3 illustrates a rear view of an example of the electronic device according to some embodiments of the present disclosure.

In one embodiment, the bracket component 4 includes a supporting arm having two straight sections bent at an obtuse angle. One end of the supporting arm is hinged to the supporting component 5 and the other end of the supporting arm is hinged to a surface of the multimedia output unit 1 opposite to the outputting surface thereof. As shown in FIG. 3 and FIG. 4, one end of the supporting arm is hinged to the rear end of the second section of the supporting component 5, and the other end of the supporting arm is hinged to a rear surface to the multimedia output unit 1. In response to the second relative position relationship between the multimedia output unit 1 and the supporting surface, bending the two straight sections at the obtuse angle may form a substantially large space for storage. As such, the structure is simple, and the structural compactness is improved.

In one embodiment, the supporting arm may be a curved arm to achieve a same effect for forming the storage space. In other embodiments, the bracket component 4 may include other structures, such as a supporting block or a supporting box, etc. to achieve a same objective for mounting and fixing the multimedia output unit 1. The present disclosure does not limit structures of the bracket component 4.

In one embodiment, the supporting arm includes a first bending arm, a second bending arm, and a horizontal arm connecting middle points of the first bending arm and the second bending arm. Each of the first bending arm and the second bending arm includes two bendable straight sections. The first bending arm, the second bending arm, and the horizontal arm form an H-shape bracket as the bracket component 4 to have a simple structure and desirable supporting strength. The gaps between the first bending arm, the second bending arm, and the horizontal arm may avoid things placed in the storage space.

In some other embodiments, the supporting arm may include a plate structure or a rectangular-shape bracket.

Figure 5:
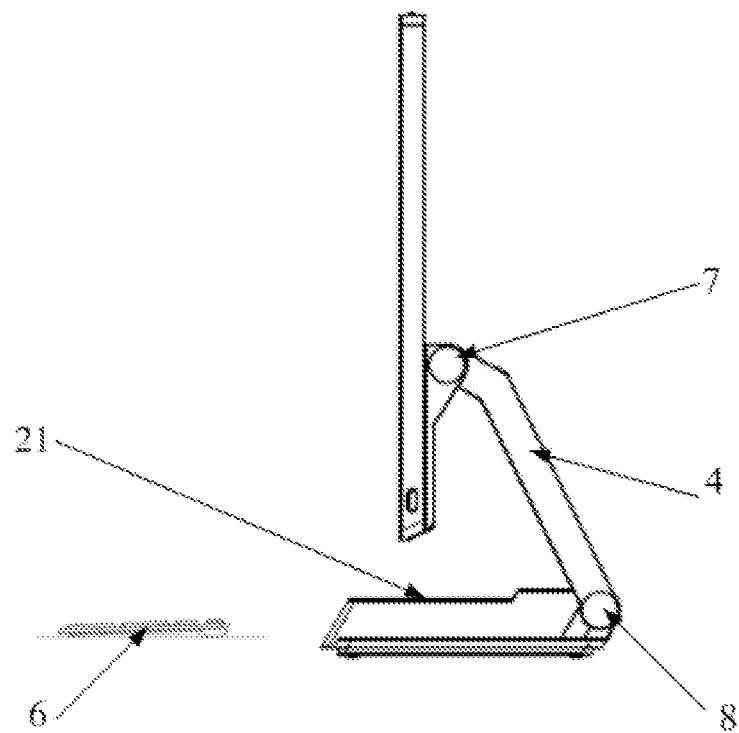
FIG. 5 illustrates a schematic view of assembling the electronic device according to some embodiments of the present disclosure.

To accommodate movable parts of the electronic device, a region 21 may be configured on the top surface of the processing unit 2 to accommodate an inputting module 6. The region 21 may be a recessed section formed on the top surface of the processing unit 2. As shown in FIG. 5, a depth of the recessed section matches a thickness of the inputting module 6 or at least is greater than the thickness of the inputting module 6. That is, after the inputting module 6 is placed in the recessed section, the inputting module 6 does not protrude above the top surface of the processing unit 2. As such, the processing unit 2 including the inputting module 6 may still be accommodated in the storage space formed by the multimedia output unit 1 and the supporting surface.

In one embodiment, the region 21 may include a plurality of mounting posts disposed on the top surface of the processing unit 2 for accommodating the inputting module 6 including a keyboard, a mouse, and a remote controller, etc. and for preventing the inputting module 6 from falling off.

In response to the electronic device being the all-in-one computer, the processing unit 2 is a platform having the computer motherboard. The platform may include heat dissipation vents, data ports, and sound outlets. The platform may also be connected to a standalone speaker (another multimedia output unit different from the previously described multimedia output unit 1). In response to the all-in-one computer being not in operation, the keyboard may be stored in a recessed section on a top surface of the platform, thereby resulting in a neat appearance. The keyboard storage does not affect the folding of the display screen.

In one embodiment, the heat dissipation vents, the data ports, and the sound outlets may be configured at a front surface (on the same side as the outputting surface of the display screen), a rear surface, or a side surface.

In one embodiment, the region for accommodating the inputting module 6 may be a slot configured at the bottom of the processing unit 2.

To further optimize the technical solutions, the electronic device may also include a wireless charging module. The wireless charging module may be configured on the top surface of the processing unit 2 and/or in the second section of the supporting component 5. In response to the wireless charging module being configured on the top surface of the processing unit 2, the wireless charging module may charge the keyboard. In response to the wireless charging module being configured in the second section of the supporting component 5, that is, adjacent to the position of the bracket component 4, the wireless charging module may charge the mouse, a smartphone, or a portable power source.

In one embodiment, the wireless charging module may reduce data wires, thereby resulting in a neat structure. In another embodiment, the electronic device may include a wired charging module.

As shown in FIGS. 1-3, a pluggable input knob may be configured on the left side of the display screen. Instructions may be inputted by rotating the input knob. The input knob may also be configured on the right side of the display screen. The input knob may be fixedly connected instead of being pluggable. The display screen may include only one knob interface and the location for the input knob may not change.

The electronic device provided by the present disclosure includes the multimedia output unit for outputting the multimedia content, the bracket component for supporting the multimedia output unit and having the first end and the second end opposite to the first end, where the second end is connected to the multimedia output unit, and the processing unit for at least transmitting the multimedia content to the multimedia output unit. In response to the electronic device being placed on the supporting surface, the orthogonal projection of the first end of the bracket component on the supporting surface is different from the orthogonal projection of the processing unit on the supporting surface.

Because the first end of the bracket component and the processing unit have different orthogonal projections on the supporting surface after the electronic device is placed on top of the supporting surface, the bracket component may not be stacked on top of the processing unit. That is, the bracket component and the processing unit may be arranged horizontally side-by-side on the supporting surface. Further, because the bracket component supports the multimedia output unit, the installation height of the multimedia output unit is indirectly lowered. Thus, the center of gravity of the electronic device is lowered, and the mechanical support stability is improved.

It should be understood by those skilled in the art that, for convenience and brevity, the description of the embodiments is arranged in a progressive manner. Each embodiment is described with a focus on differences from other embodiments while reference is made for similarities between different embodiments.

Various embodiments have been described to illustrate the operation principles and exemplary implementations. It should be understood by those skilled in the art that the present disclosure is not limited to the specific embodiments described herein and that various other obvious changes, rearrangements, and substitutions will occur to those skilled in the art without departing from the scope of the disclosure. Thus, while the present disclosure has been described in detail with reference to the above described embodiments, the present disclosure is not limited to the above described embodiments, but may be embodied in other equivalent forms without departing from the scope of the present disclosure, which is determined by the appended claims.

What is claimed is:

1. An electronic device, comprising:
a multimedia output unit including an outputting surface for outputting multimedia content;
a bracket component for supporting the multimedia output unit and having a first end and a second end opposite to the first end, wherein the second end is connected to the multimedia output unit, the bracket component includes a supporting arm including a first straight section and a second straight section forming an obtuse angle, and the second straight section is connected to the multimedia output unit via the second end; and
a processing unit for transmitting the multimedia content to the multimedia output unit, the first straight section of the bracket component being connected to the processing unit via the first end of the bracket component;
wherein:
in response to the electronic device being placed on a supporting surface, an orthogonal projection of the first end of the bracket component on the supporting surface is positioned differently from an orthogonal projection of the processing unit on the supporting surface; and
in response to the multimedia output unit being placed on the supporting surface:
the entire bracket component is lower than a top surface of the processing unit; and
a surface of the multimedia output unit opposite to the outputting surface is parallel to and abuts against the second straight section of the bracket component.

2. The electronic device according to claim 1, further comprising:
a supporting component having a first side and a second side opposite to the first side,
wherein:

in response to the electronic device being placed on the supporting surface, the supporting component supports all other modules of the electronic device, and the first side faces toward the supporting surface;
the first end of the bracket component is in a first region on the second side;
the processing unit is in a second region on the second side; and
the first region and the second region are different.

3. The electronic device according to claim 2, wherein: the first region and the second region are adjacent to each other.

4. The electronic device according to claim 2, wherein: the supporting component includes a supporting bottom plate; and
both the processing unit and the bracket component are on the supporting bottom plate.

5. The electronic device according to claim 2, wherein: the multimedia output unit rotates relative to the supporting surface through a hinge structure;
the hinge structure includes a first hinge structure connecting the multimedia output unit and the second end of the bracket component and a second hinge structure connecting the first end of the bracket component and the supporting component;
by rotating the first hinge structure and the second hinge structure, the multimedia output unit and the supporting surface change from a first relative position relationship to a second relative position relationship;
in the second relative position relationship, one end of the multimedia output unit contacts the supporting surface, and the supporting surface and the bracket component jointly support the multimedia output unit; and
in response to the second relative position relationship between the multimedia output unit and the supporting surface, the multimedia output unit and the supporting surface form an accommodating space to accommodate the processing unit, and the bracket component and the supporting component form a storage space.

6. The electronic device according to claim 2, wherein: the multimedia output unit rotates relative to the supporting surface through a hinge structure;
an orthogonal projection of the multimedia output unit on the supporting surface at least partially overlaps with orthogonal projections of the first region and the second region on the supporting surface;
the supporting component includes a first section and a second section adjacent to the first section;
the processing unit is disposed in the first section; and
the bracket component is connected to a portion of the second section away from the outputting surface of the multimedia output unit.

7. The electronic device according to claim 1, wherein: the supporting arm includes a first bending arm including the first straight section and the second straight section, a second bending arm, and a horizontal arm connecting middle points of the first bending arm and the second bending arm;
the second bending arm includes a third straight section and a fourth straight section forming an obtuse angle;
the third straight section is connected to the processing unit via the first end of the bracket component;
the fourth straight section is connected to the multimedia output unit via the second end of the bracket component; and
in response to the multimedia output unit being placed on the supporting surface, the surface of the multimedia output unit opposite to the outputting surface also is parallel to and abuts against the fourth straight section.

8. An electronic device, comprising:
a multimedia output unit including an outputting surface for outputting multimedia content;
a bracket component for supporting the multimedia output unit and having a first end and a second end opposite to the first end, wherein the second end is connected to the multimedia output unit, the bracket component includes a supporting arm including a first straight section and a second straight section forming an obtuse angle, and the second straight section is connected to the multimedia output unit via the second end; and
a processing unit for transmitting the multimedia content to the multimedia output unit, a region for accommodating an inputting unit being on a top surface of the processing unit, the first straight section of the bracket component being connected to the processing unit via the first end of the bracket component;
wherein:
in response to the electronic device being placed on a supporting surface, an orthogonal projection of the first end of the bracket component on the supporting surface is positioned differently from an orthogonal projection of the processing unit on the supporting surface; and
in response to the multimedia output unit being placed on the supporting surface:
the entire bracket component is lower than the top surface of the processing unit; and
a surface of the multimedia output unit opposite to the outputting surface is parallel to and abuts against the second straight section of the bracket component.

9. The electronic device according to claim 8, further comprising:
a supporting component having a first side and a second side opposite to the first side,
wherein:
in response to the electronic device being placed on the supporting surface, the supporting component supports all other modules of the electronic device, and the first side faces toward the supporting surface;
the first end of the bracket component is in a first region on the second side;
the processing unit is in a second region on the second side; and
the first region and the second region are different.

10. The electronic device according to claim 9, wherein: the first region and the second region are adjacent to each other.

11. The electronic device according to claim 9, wherein: the supporting component includes a supporting bottom plate; and
both the processing unit and the bracket component are on the supporting bottom plate.

12. An electronic device, comprising:
a multimedia output unit including an outputting surface for outputting multimedia content;
a bracket component for supporting the multimedia output unit and having a first end and a second end opposite to the first end, wherein the second end is connected to the multimedia output unit, the bracket component includes a supporting arm including a first straight section and a second straight section forming an obtuse angle, and the second straight section is connected to the multimedia output unit via the second end;

a supporting component having a first side and a second side opposite to the first side;

a wireless charging component on a top surface of the processing unit or on the second side of the supporting component; and a processing unit for transmitting the multimedia content to the multimedia output unit, the first straight section of the bracket component being connected to the processing unit via the first end of the bracket component;

wherein:

in response to the electronic device being placed on a supporting surface, an orthogonal projection of the first end of the bracket component on the supporting surface is positioned differently from an orthogonal projection of the processing unit on the supporting surface; and in response to the multimedia output unit being placed on the supporting surface:

the entire bracket component is lower than the top surface of the processing unit; and a surface of the multimedia output unit opposite to the outputting surface is parallel to and abuts against the second straight section of the bracket component.

13. The electronic device according to claim 12, wherein:

in response to the electronic device being placed on the supporting surface, the supporting component supports all other modules of the electronic device, and the first side faces toward the supporting surface;

the first end of the bracket component is in a first region on the second side;

the processing unit is in a second region on the second side; and the first region and the second region are different.

14. The electronic device according to claim 13, wherein:

the first region and the second region are adjacent to each other.

15. The electronic device according to claim 13, wherein:

the supporting component includes a supporting bottom plate;

both the processing unit and the bracket component are on the supporting bottom plate;

the first end of the bracket component is lower than the top surface of the processing unit;

the multimedia output unit rotates relative to the supporting surface through a hinge structure;

the hinge structure includes a first hinge structure connecting the multimedia output unit and the second end of the bracket component and a second hinge structure connecting the first end of the bracket component and the supporting component;

by rotating the first hinge structure and the second hinge structure, the multimedia output unit and the supporting surface change from a first relative position relationship to a second relative position relationship; and in response to the second relative position relationship between the multimedia output unit and the supporting surface, the multimedia output unit and the supporting surface form an accommodating space to accommodate the processing unit, and the bracket component and the supporting component form a storage space.

16. The electronic device according to claim 15, wherein:

the first end of the bracket component is configured on the supporting bottom plate indirectly through an intermediate connecting plate.

17. The electronic device according to claim 5, wherein:

in response to the second relative position relationship between the multimedia output unit and the supporting surface, an orthogonal projection of the bracket component on a plane including an upper surface of the supporting component is within an area of the upper surface of the supporting component.

18. The electronic device according to claim 7, wherein:

the horizontal arm is connected rigidly to the middle points of the first bending arm and the second bending arm to form an integral structure.

19. The electronic device according to claim 7, wherein:

the horizontal arm is perpendicular to a plane on which the first bending arm lies and a plane on which the second bending arm lies.

* * * * *